(12) United States Patent
Yasuda et al.

(10) Patent No.: US 12,274,249 B2
(45) Date of Patent: Apr. 15, 2025

(54) FISHING REEL

(71) Applicant: GLOBERIDE, Inc., Tokyo (JP)

(72) Inventors: Hiromu Yasuda, Tokyo (JP); Motohiro Nonogaki, Tokyo (JP)

(73) Assignee: GLOBERIDE, Inc., Tokyo (JP)

( * ) Notice: Subject to any disclaimer, the term of this patent is extended or adjusted under 35 U.S.C. 154(b) by 291 days.

(21) Appl. No.: 17/980,692

(22) Filed: Nov. 4, 2022

(65) Prior Publication Data
US 2023/0138979 A1 May 4, 2023

(30) Foreign Application Priority Data
Nov. 4, 2021 (JP) .................. 2021-180326

(51) Int. Cl.
*A01K 89/01* (2006.01)
*A01K 89/017* (2006.01)
(Continued)

(52) U.S. Cl.
CPC ......... *A01K 89/017* (2013.01); *H05K 5/0026* (2013.01); *H05K 5/0086* (2013.01); *H05K 5/06* (2013.01)

(58) Field of Classification Search
CPC ............ A01K 89/017; A01K 89/01928; A01K 89/01555; A01K 89/033
See application file for complete search history.

(56) References Cited

U.S. PATENT DOCUMENTS 5,752,461 A * 5/1998 Whisenhunt ........... A01K 91/08
 43/27.4
2004/0227029 A1* 11/2004 Ikuta ................ A01K 89/01555
 242/288

(Continued)

FOREIGN PATENT DOCUMENTS

CN 1550133 A 12/2004
CN 101467523 A 7/2009
(Continued)

OTHER PUBLICATIONS

May 30, 2024 Office Action issued in Chinese Patent Application No. 202211368427.8.
(Continued)

*Primary Examiner* — Emmanuel M Marcelo
(74) *Attorney, Agent, or Firm* — Oliff PLC

(57) ABSTRACT

A fishing reel comprises: a circuit board; a plurality of electrical components electrically connected to the circuit board; an external-device connection unit electrically connected to the circuit board; and a watertight structure to accommodate the circuit board inside. The external-device connection unit comprises: an external connection part disposed outside of the watertight structure, the external connection part being designed to electrically connect to a connector of an external device; an internal connection part disposed inside of the watertight structure, the internal connection part being designed to electrically connect to the circuit board and the external connection part; an internal waterproof part to make a gap between the external connection part and the internal connection part waterproof; a housing to hold the external connection part, the internal connection part, and the internal waterproof part; and an external waterproof part to make a gap between the housing and the watertight structure waterproof.

6 Claims, 5 Drawing Sheets

(51) Int. Cl.
  *H05K 5/00*   (2006.01)
  *H05K 5/06*   (2006.01)

(56)              References Cited

U.S. PATENT DOCUMENTS

2015/0333435  A1     11/2015  Arai et al.
2018/0343845  A1*    12/2018  Shen ................... A01K 97/125

FOREIGN PATENT DOCUMENTS

| CN | 103814874 | A | * | 5/2014 | ........... A01K 89/017 |
| JP | 3545095 | B2 | | 7/2004 | |
| JP | 2004357601 | A | | 12/2004 | |
| JP | 4362412 | B2 | | 11/2009 | |
| JP | 2012059540 | A | | 3/2012 | |
| JP | 5433776 | B1 | | 3/2014 | |
| JP | 2015044465 | A | | 3/2015 | |
| JP | 2018019618 | A | | 2/2018 | |
| KR | 20160093553 | A | * | 8/2016 | ........... A01K 89/017 |

OTHER PUBLICATIONS

Taiwanese Office Action in connection with Taiwanese Patent Application No. 111140033; action mailed on Jul. 24, 2023; (8 pages).
Dec. 24, 2024 Office Action issued in Korean Application No. 10-2022-0143303.
Dec. 24, 2024 Office Action issued in Japanese Application No. 2021-180326.

* cited by examiner

FISHING REEL

CROSS-REFERENCE TO RELATED APPLICATIONS

This application claims priority under 35 U.S.C. § 119 to Japanese Patent Application No. 2021-180326 filed on Nov. 4, 2021 in the Japanese Patent Office, the entire contents of each hereby incorporated by reference.

FIELD

The present disclosure relates to a fishing reel that includes an electronic substrate.

BACKGROUND

Conventionally, some double bearing reels for fishing have been provided with electric circuits that include microcomputers to serve purposes such as controlling a motor for retrieving a fishing line, displaying a line length, and controlling a brake on a casting reel. JP 2004-357601 A discloses a fishing reel that has an external-device connection unit to electrically connect such an electric circuit to an external device such as a personal computer.

JP 2004-357601 A discloses an electronic circuit device for fishing tackle for use in fishing. The electronic circuit device includes: a circuit board that has a printed circuit at least on a surface; a plurality of electrical components, including a microcomputer for controlling the fishing tackle through a control program, that are disposed on the circuit board to electrically connect to the printed circuit; the external-device connection unit disposed on the circuit board to electrically connect to the printed circuit, the external-device connection unit being configured to connect to an external device; and an insulating film covering the electrical components as well as at least part of the circuit board except the external-device connection unit.

SUMMARY

The fishing reel of JP 2004-357601 A makes the circuit board waterproof by covering the circuit board except the external-device connection unit with the insulating film. However, the fishing reel does not have a watertight structure around the circuit board. Thus, to make the external-device connection unit and other electrical components waterproof, the components need to be individually made waterproof. This puts a limit on miniaturization of the overall reel apparatus. Since terminals are arranged in a direction of thickness of the board, the apparatus tends to increase in the thickness direction. This puts a constraint on miniaturization of the overall reel apparatus.

In view of the above background, it is an object of the present disclosure to provide a fishing reel that makes components of its own waterproof despite being equipped with a connecting terminal for external and electrical connection while avoiding an increase in apparatus size. Purposes of the present disclosure other than this object will be clarified by referring to the overall description disclosed herein.

A fishing reel according to an embodiment of the present disclosure comprises: a circuit board that has a printed circuit on a surface; a plurality of electrical components electrically connected to the circuit board, the plurality of the electrical components comprising a microcomputer to control the fishing reel through a control program; an external-device connection unit electrically connected to the circuit board, the external-device connection unit being configured to connect to an external device; and a watertight structure to accommodate the circuit board inside. The external-device connection unit comprises: an external connection part disposed outside of the watertight structure, the external connection part being designed to electrically connect to a connector of the external device; an internal connection part disposed inside of the watertight structure, the internal connection part being designed to electrically connect to the circuit board and the external connection part; an internal waterproof part to make a gap between the external connection part and the internal connection part waterproof; a housing to hold the external connection part, the internal connection part, and the internal waterproof part; and an external waterproof part to make a gap between the housing and the watertight structure waterproof.

The fishing reel according an embodiment of the present disclosure comprises: a spool designed to wind a fishing line by operation with an operating part; a first side plate having the operating part, the first side plate axially supporting the spool; a second side plate disposed opposite to the first side plate when viewed along an axis of the spool, the second side plate axially supporting the spool; and an opposite side cover or a cover on an opposite side from the operating part, the opposite side cover covering the second side plate on a side opposed to the operating part. The opposite side cover is included in a part of the watertight structure. The opposite side cover has a through-hole that is open in a direction along the axis of the spool. The external-device connection unit is disposed by being inserted into the through-hole and is held by a holding member fixed to the opposite side cover.

In the fishing reel according to an embodiment of the present disclosure, the circuit board and the external-device connection unit are disposed beside each other in a direction in which the circuit board extends.

In the fishing reel according to an embodiment of the present disclosure, the watertight structure accommodates a secondary battery that is rechargeable and is designed to supply or charge the secondary battery with electricity through the external-device connection unit to which the external device is connected.

In the fishing reel according to an embodiment of the present disclosure, the secondary battery and the external-device connection unit are disposed beside each other in a direction orthogonal to the axis of the spool.

In the fishing reel according to an embodiment of the present disclosure, the opposite side cover has a recess outside of the watertight structure, and a cover member is detachably attached to the recess of the opposite side cover to protect the external-device connection unit against dust.

According to the embodiment above, the external-device connection unit is not only designed to connect to the external device but also takes a part in a function of the watertight structure. This configuration, even though the fishing reel is provided with the external-device connection unit, allows the electrical components to be accommodated inside the watertight structure. Thus, the fishing reel appropriately and reliably provides the waterproof structure while avoiding an increase in overall apparatus size.

DETAILED DESCRIPTION

An embodiment of a fishing reel according to the present disclosure will now be described in detail with reference to the accompanying drawings. Components common among multiple drawings are denoted by the same reference signs in the multiple drawings. It should be noted that for the convenience of description, the drawings are not always shown in a precise aspect ratio.

With reference to FIGS. 1 to 4, a fishing reel according to an embodiment of the present disclosure and a braking device included in the fishing reel will be described. Illustration and description of some known functions of a fishing reel 1 are omitted for the simplicity of description.

Figure 1:
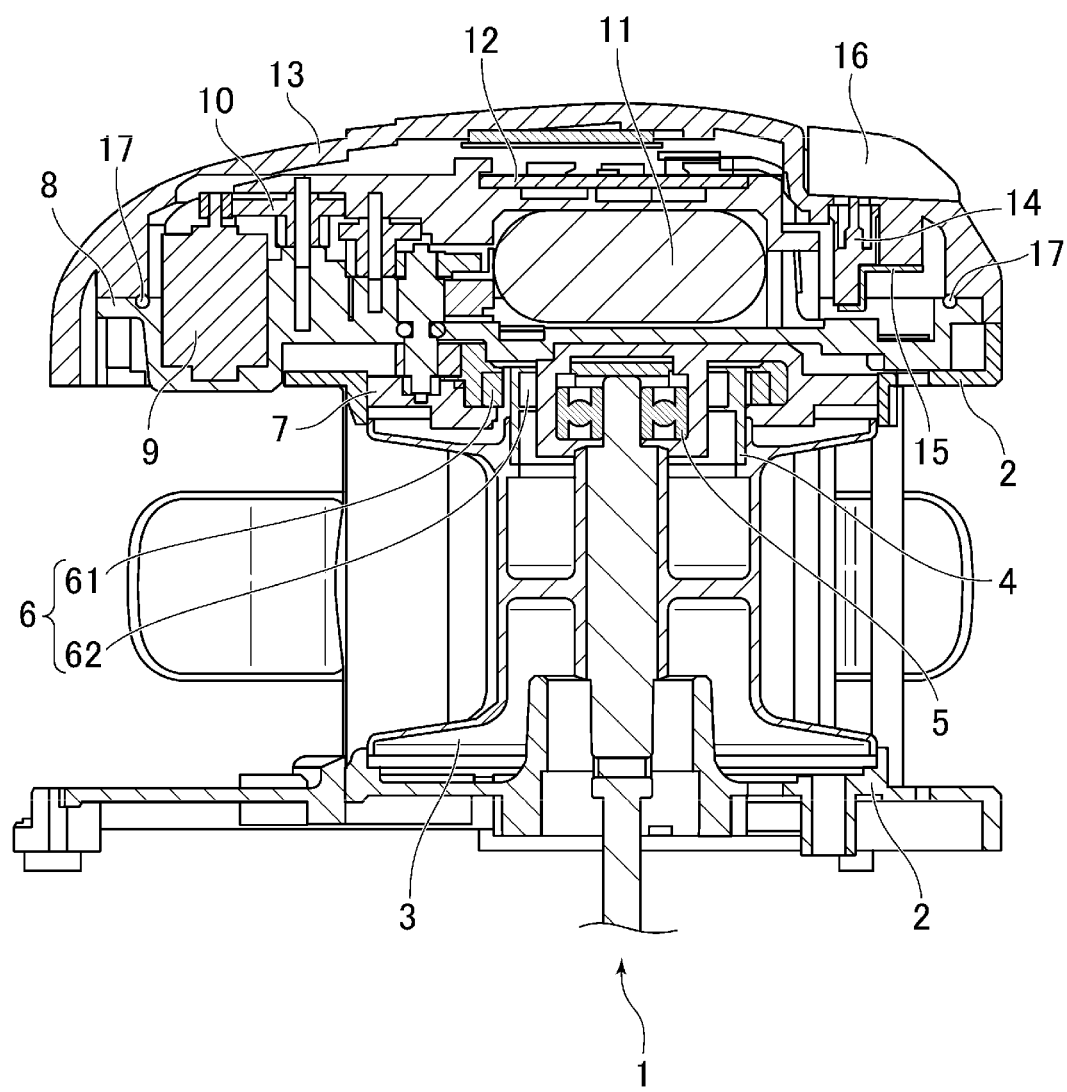
FIG. 1 is a drawing illustrating a fishing reel according to an embodiment of the present disclosure.

FIG. 1 is a cross-sectional view of the fishing reel 1, showing a cross section taken along a central axis of a reduction gear train described later. Illustration and description of some known functions of a fishing reel 1 are omitted for the simplicity of description.

As shown in FIG. 1, the fishing reel 1 according to an embodiment of the present disclosure comprises a frame (main reel body) 2, a spool 3, a braked part (braked means) 4, a bearing 5, a braking part (braking means) 6, a set plate 7, an inner lid 8, a motor 9, a deceleration mechanism (reduction gear train) 10, a battery 11, a circuit board (control substrate) 12, a cover 13 opposite on an opposite side from an operating part (an opposite side cover 13), an external-device connection unit 14, a holding member 15, a cap 16, and a waterproof joining member 17. However, elements other than these components may be included.

The frame (main reel body) 2 is made so as to be attachable to a fishing rod (not shown). The fishing reel 1 according to an embodiment of the present disclosure, in a similar way to the conventional fishing reel, has an operating part or operating means (not shown, e.g., a handle) that allows the spool 3 to be rotated in a forward direction by a user's operation to retrieve a fishing line. A rotating force caused by the operating part or operating means (hereinafter referred to as the operating part) is transmitted to the spool 3 through transmission means such as a gear (not shown).

The fishing reel 1 according to an embodiment of the present disclosure has a clutch part (or clutch means, not shown). By operating the clutch part (or clutch mean), the user is able to select whether a clutch for power transmission engages with or disengages from the spool 3. When the clutch for power transmission is engaged with the spool 3, the fishing line can be retrieved by the operating part. On the other hand, when the clutch for power transmission is disengaged from the spool 3, the spool is allowed to freely rotate in forward and reverse directions and the fishing line can be released.

The fishing reel 1 according to an embodiment of the present disclosure may comprise a drag part or drag means (not shown) to allow the spool 3 to run at idle in the event of torque of a predetermined level or higher and thereby prevent the fishing line from being broken or may comprise a counter rotation preventive part or counter rotation preventive means (not shown) to prevent the operating part from counter rotating. Moreover, an oscillator device (not shown) may be provided to evenly retrieve the fishing line by allowing a position of a fishing line guiding part that guides the fishing line to reciprocate in response to the rotation of the spool 3.

The spool 3 is supported by the main reel body 2 so as to be rotatable relative to the main reel body 2. The spool 3 rotates in the forward direction and thereby makes it possible to retrieve and wind the fishing line on an outer peripheral area of the spool 3. On the other hand, a lure or something similar is cast when the spool 3 rotates in the reverse direction and makes it possible to release the wound fishing line. At this time, if an amount of the released fishing line is much larger than an amount of travel of the lure or the like, line entanglement called a backlash can occur due to an excessive portion of the fishing line, preventing proper use of the fishing reel 1 in some cases. Hence, appropriate braking force may be applied to the spool 3 by a braking device 10 described later to prevent such a backlash.

The braked part 4 is fixed to the spool 3 and receives braking force caused by the braking part 6. In the fishing reel 1 according to an embodiment of the present disclosure, the braking part 6 uses an eddy current braking system to generate eddy currents by applying a magnetic field to a conductive plate through a permanent magnet. The braking force caused by the braking part 6 to the braked part 4 is adjustable by the motor 9.

Figure 2A:
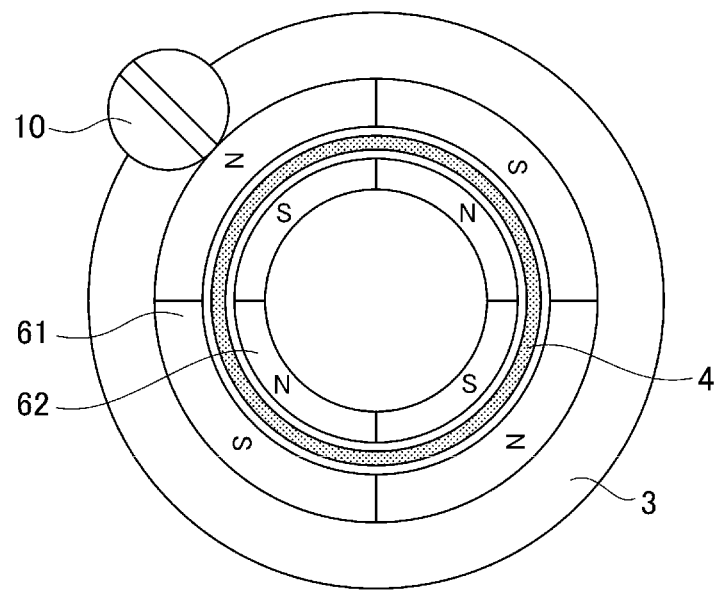
FIGS. 2A to 2B are drawings showing a configuration of a braking device according to an embodiment of the present disclosure.
Figure 2B:
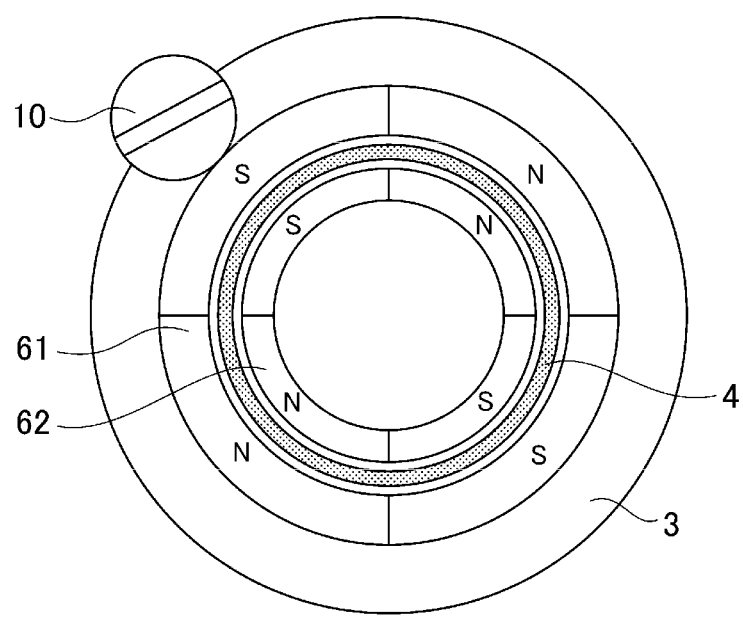

Next, with reference to FIGS. 2A and 2B, a structure of the braking part 6 in the fishing reel 1 according to an embodiment of the present disclosure will be described. As shown in the drawings, the braking part 6 comprises a rotating magnet 61 supported by the set plate 7 (not shown) so as to be rotatable and a stationary magnet 62 fixed to the set plate 7 (not shown). The rotating magnet 61 and the stationary magnet 62 form a magnetic circuit, and a magnetic field generated by the magnetic circuit is formed so as to pass through the braked part 4 made of a conductor. Thus, braking force proportional to intensity of the magnetic field and rotation speed of the spool 3 is caused to the braked part 4. Power produced by the motor 9 is transmitted to the rotating magnet 61 through a gear or such means to enable the rotating magnet 61 to rotate. In this way, by shifting the rotating magnet 61 to a predetermined place (a shift from a state in FIG. 2A to a state in FIG. 2B by rotation of the rotating magnet 61) and adjusting the braking force applied to the braked part 4, which is fixed to the spool 3, the rotation speed of the spool 3 can be adjusted.

As for the fishing reel 1 according to an embodiment of the present disclosure, the system for adjusting the braking force is not limited to any specific style. A known braking system that can be appropriately used as the system for adjusting the braking force is, for example, a friction system by which frictional force is applied to the braked part 4 and a dynamic braking system by which braking force is caused by a coil to a permanent magnet attached to the spool 3, but the system for adjusting the braking force is not limited to these systems. As described later, such braking means is not a requisite function of the present disclosure, and a control circuit may be used for a purpose other than adjusting the braking means.

The frame 2 comprises a first part of the frame 2 on a side having the operating part described above and a second part of the frame 2 on a side opposed to the side having the operating part when viewed along an axis of the spool 3. The frame 2 is configured such that the set plate 7 is allowed to be attached to the second part of the frame 2. The first part has a surface (referred to as a first surface) orthogonal to a rotating shaft of the spool 3, and the second part has a surface parallel to the first surface and clamps the spool shaft together with the first surface. This configuration axially supports one end of the spool 3 by the first part of the frame 2 and the other end of the spool 3 by the set plate 7 via a respective bearing 5. In the fishing reel 1 according to an embodiment of the present disclosure, the first part of the frame 2 is referred to as a first side plate 21 of the frame 2, and the second part of the frame 2 is referred to as a second side plate 22 of the frame 2. The second side plate may comprise the set plate and other elements but is not limited to any specific style.

In the fishing reel 1 according to an embodiment of the present disclosure, the set plate 7 and the inner lid 8 are made of separate materials and are fastened to each other with screws or other fasteners to achieve purposes such as reducing weight, reducing costs, and ensuring strength. This allows other parts to be accommodated between the set plate 7 and the inner lid 8. Meanwhile, the set plate 7 and the inner lid 8 may be an integrated part to help reduce a number of parts.

The inner lid 8 is fixed to the opposite side cover 13 so as to make an internal space airtight. This prevents ingress of water and other substances into components accommodated in the internal space. The waterproof joining member (waterproof joining means) 17 implemented by a gasket such as an O-ring, a waterproof sponge such as an urethane foam body, a double-sided waterproof tape, a laser welded part, a seal-case structure, waterproof grease, or other similar stuff may be disposed as a closed loop throughout a peripheral face where the inner lid 8 and the opposite side cover 13 are joined together to prevent ingress of water and foreign matter from outside into the space (internal space) formed by the inner lid 8 and the opposite side cover 13. The motor 9, the deceleration mechanism (reduction gear train) 10, the battery 11, the circuit board (control substrate) 12, and part of the external-device connection unit 14 are accommodated in the internal space formed in this way to make these components waterproof.

A watertight structure referred to herein is basically a structure made up of the inner lid 8, the opposite side cover 13, and the waterproof joining member disposed on the joined face of these parts. However, it should be noted that in a region, described later, in which the external-device connection unit 14 is disposed, a waterproof loop is formed such that the opposite side cover 13, an external waterproof part 146, a left side part of a housing 141, an internal waterproof part 145, a right side part of the housing 141, the external waterproof part 146, and the opposite side cover 13 are joined together in this order from left to right in a lateral direction of the cross-sectional view on a paper surface in FIG. 4, which is described later, and the waterproof loop takes a part in a function of the watertight structure for the region.

Figure 3:
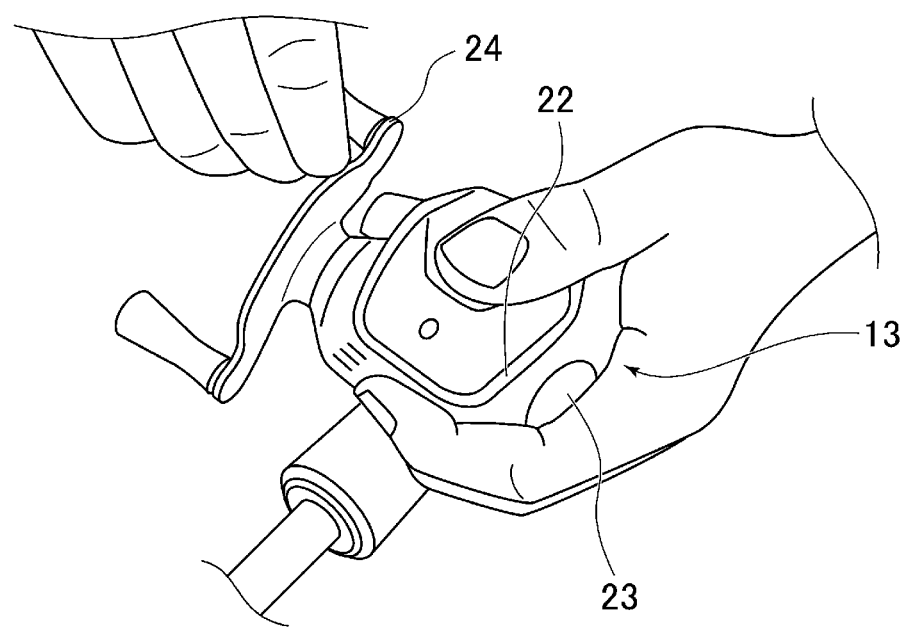
FIG. 3 is a drawing illustrating an outside surface of a cover on an opposite side from an operating part of a fishing reel according to an embodiment of the present disclosure.

Next, as shown in FIG. 3, a palm-side portion 23 is formed on an outside surface of the opposite side cover 13. The palm-side portion 23 has a convex shape that is curved outward from the opposite side cover 13 (curved toward a side opposite the operating part 24 with respect to the second side plate 22) such that the user's hand is allowed to be put on and hold the fishing reel. For instance, the palm-side portion 23 may have a substantially spherical shape that is convexly curved outward from the opposite side cover 13 (curved toward a side opposite the operating part 24 with respect to the second side plate 22). However, the convex shape can be made in various styles in consideration of friendliness to palm and is not limited to any specific style. The convex shape referred to herein is a part of a substantially spherical shape or an ellipsoid with a radius of curvature approximately equal to that of curved palms of general users, for example, and is a shape without any large protrusion and acute-angled part to ensure that the shape does not give the user a sense of discomfort but allows the user's hand to be put on and readily hold the fishing reel. (The same applies throughout this specification). This enables the user to stably hold the fishing reel when casting a lure or something similar or handling the operating part.

The opposite side cover 13 in itself may have a convex shape that is curved outward from the opposite side cover 13 (curved toward a side opposite the operating part with respect to the second side plate 22). This configuration provides the opposite side cover 13 with both friendliness to palm and ease of manufacturability.

A fishing reel according to an embodiment of the present disclosure comprises: a circuit board that has a printed circuit on a surface; a plurality of electrical components electrically connected to the circuit board, the plurality of the electrical components comprising a microcomputer to control the fishing reel through a control program; an external-device connection unit electrically connected to the circuit board, the external-device connection unit being configured to connect to an external device; and a watertight structure to accommodate the circuit board inside. The external-device connection unit comprises: an external connection part disposed outside of the watertight structure, the external connection part being designed to electrically connect to a connector of the external device; an internal connection part disposed inside of the watertight structure, the internal connection part being designed to electrically connect to the circuit board and the external connection part; an internal waterproof part to make a gap between the external connection part and the internal connection part waterproof; a housing to hold the external connection part, the internal connection part, and the internal waterproof part; and an external waterproof part to make a gap between the housing and the watertight structure waterproof.

With regard to the fishing reel according to an embodiment of the present disclosure, the external-device connection unit is not only designed to connect to the external device but also takes a part in a function of the watertight structure. This configuration, even though the fishing reel is provided with the external-device connection unit, allows the electrical components to be accommodated inside the watertight structure. Thus, the fishing reel appropriately and reliably provides the waterproof structure while avoiding an increase in overall apparatus size.

The fishing reel according an embodiment of the present disclosure comprises: a spool designed to wind a fishing line by operation with an operating part; a first side plate having the operating part, the first side plate axially supporting the spool; a second side plate disposed opposite to the first side plate when viewed along an axis of the spool, the second side plate axially supporting the spool; and an opposite side cover or a cover on an opposite side from the operating part, the opposite side cover covering the second side plate on a side opposed to the operating part. The second side plate and the opposite side cover are included in a part of the watertight structure. The opposite side cover has a through-hole that is open in a direction along the axis of the spool. The external-device connection unit is disposed by being inserted into the through-hole and is held by a holding member fixed to the opposite side cover.

With regard to the fishing reel according to an embodiment of the present disclosure, the connector of the external device can access the external-device connection unit without the necessity of disassembling the reel. This improves usability in an application where a connector is frequently removed and inserted. When the opposite side cover is formed by molding, an opening can be disposed in a direction in which a mold is drawn out (removed). This provides both waterproofness and cost reduction and makes it possible to form a mechanical structure that can withstand connector removal and insertion performed with high frequency.

In the fishing reel according to an embodiment of the present disclosure, the circuit board and the external-device connection unit are disposed beside each other in a direction in which the circuit board extends. This can avoid an increase in internal size of the watertight structure in a direction of thickness. This leads to miniaturization of the overall reel apparatus.

In the fishing reel according to an embodiment of the present disclosure, the watertight structure accommodates a secondary battery that is rechargeable and is designed to supply or charge the secondary battery with electricity through the external-device connection unit to which the external device is connected. With the external-device connection unit being connectable from outside the apparatus, this makes it possible to charge the battery with electricity without the necessity of disassembling the fishing reel. In the fishing reel according to an embodiment of the present disclosure, the secondary battery and the external-device connection unit are disposed beside each other in a direction orthogonal to the axis of the spool. This avoids an increase in internal size of the watertight structure in the direction of thickness and thus leads to miniaturization of the overall reel apparatus.

In the fishing reel according to an embodiment of the present disclosure, the opposite side cover has a recess outside of the watertight structure, and a cover member is detachably attached to the recess of the opposite side cover to protect the external-device connection unit against dust. This enables the fishing reel to maintain friendliness to palm, avoid an increase in apparatus size, and prevent ingress of water, dust, and other foreign matter from outside. By removing the cover member, the external-device connection unit can be used to connect to the external device.

The circuit board (control substrate) 12 includes a printed board on which conductor routing is formed by printing or other technique and has a control circuit such as a microcomputer. The circuit board (control substrate) 12 may include detection means of every kind such as a temperature sensor and a motion sensor, input means such as a button, output means such as a light-emitting diode (LED), communication means such as a radio communication module, or storage means such as flash memory.

This enables the circuit board to sense a state of fishing reel 1, store such information, or send or output such information externally. The fishing reel 1 according to an embodiment of the present disclosure includes a motor driver and thus is able to control the motor 9. This enables the circuit board to adjust braking force of the braking device in response to the state of the fishing reel 1. In the fishing reel 1 according to an embodiment of the present disclosure, a role of the circuit board (control substrate) 12 is not limited to controlling of the braking device. The circuit board (control substrate) 12 may also be used to control various motors for the fishing reel 1, such as a motor for retrieving the fishing line, a drag force setting motor, and a motor for switching between clutch engagement and disengagement.

Figure 4:
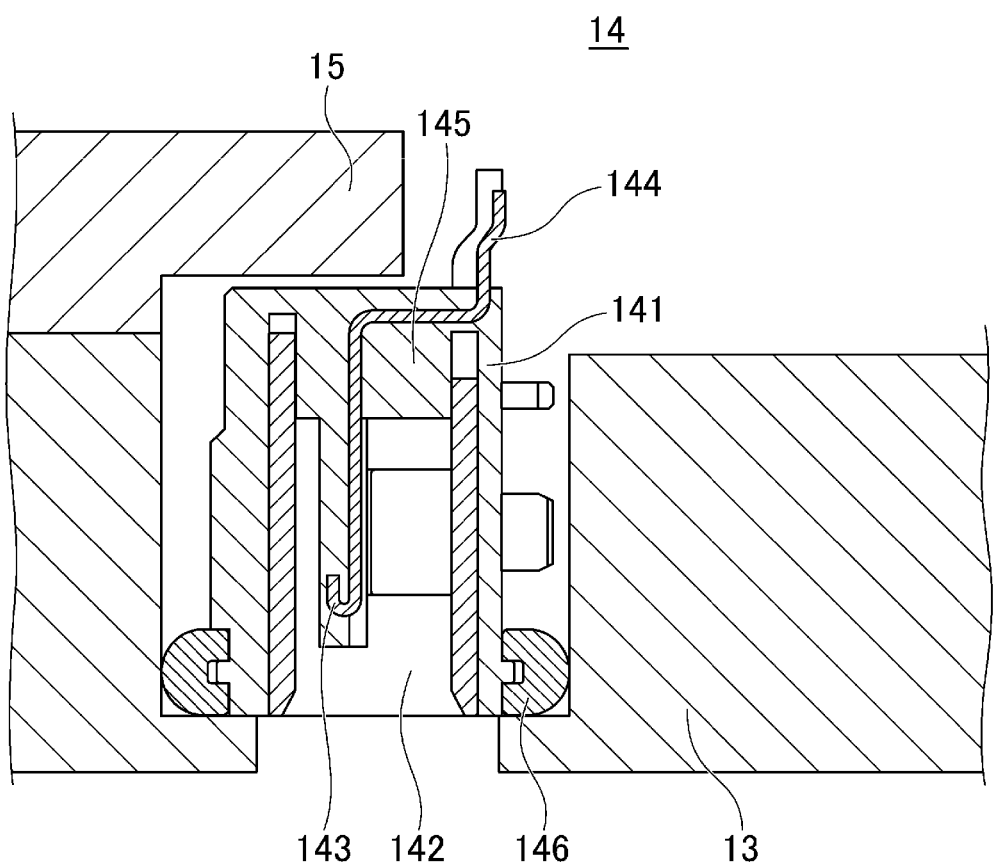
FIG. 4 is a drawing illustrating an external-device connection unit in a fishing reel according to an embodiment of the present disclosure.

Next, with reference to FIG. 4, the external-device connection unit 14 in the fishing reel 1 according to an embodiment of the present disclosure will be described. As shown in FIG. 4, the external-device connection unit 14 includes, for example, the housing 141, and the housing 141 has an opening 142 inside that is open to an outside of the reel apparatus (an outside of the opposite side cover 13 of the fishing reel 1). A connector of an external device can be inserted through the opening. The external-device connection unit has, inside the opening 142, an external connection part 143 that is designed to electrically connect to the connector of the external device. The external connection part (outside connection part) 143 is designed to electrically connect to an internal connection part (inside connection part) 144. A gap between the external connection part 143 and the internal connection part 144 is filled with an electrically insulating resin or other material and thereby forms the internal waterproof part 145 to prevent ingress of water and other matter.

As described above, in the region where the external-device connection unit 14 is disposed, a watertight structure for the region is formed such that the opposite side cover 13, the external waterproof part 146, the left side part of the housing 141, the internal waterproof part 145, the right side part of the housing 141, the external waterproof part 146, and the opposite side cover 13 are joined together in this order from left to right in the lateral direction of the cross-sectional view on the paper surface in FIG. 4. Thus, in the external-device connection unit 14, whereas the external connection part (outside connection part) 143 is disposed outside of (outside) the watertight structure and designed to electrically connect to the connector of the external device, the internal connection part (inside connection part) 144 is disposed inside of (inside) the watertight structure and designed to electrically connect to the circuit board and the external connection part. This configuration, even though the fishing reel 1 is provided with the external-device connection unit 14, allows the watertight structure to be appropriately and reliably maintained.

As shown in FIG. 4, the housing 141 is inserted into a through-hole, described later, that is formed in the opposite side cover 13. Between an opening-side end of the housing and an end of the opposite side cover 13, the external waterproof part 146 is formed by a gasket member such as an elastomer along a perimeter of the opening 142 to provide waterproofness together with a structural member (the opposite side cover) that supports the housing 141. The external waterproof part 146 may be a waterproof sponge such as a urethane foam body, a double-sided waterproof tape, a laser welded part, a seal-case structure, waterproof grease, or such stuff, other than the gasket member such as an elastomer, but is not limited to these substances.

Even if water enters into the opening 142, the fishing reel 1 including such external-device connection unit 14 prevents ingress of the water into the watertight structure by action of the internal waterproof part. When moisture that has entered into the opening disappears by evaporation or similar action, the external-device connection unit can properly connect with the connector of the external device again. Appropriate water-repellent treatment may be applied to an inside or a periphery of the opening to reduce ingress of water into the opening. An appropriate drainage part may be provided for the periphery of the opening to quickly drain off moisture that has entered into the opening.

The internal connection part 144 of the external-device connection unit 14 is electrically connected to the circuit board (control substrate) 12. The external connection part 143 of the external-device connection unit 14 is connected to the connector of the external device. The external-device connection unit 14 is, for example, a universal serial bus (USB) connector and can be used to supply the circuit board (control substrate) 12 with electricity, supply or charge a secondary battery with electricity, and enable the circuit board (control substrate) 12 and the external device to communicate with each other. This enables the fishing reel to rewrite a program or a setting value on the microcomputer inside the circuit board (control substrate) 12 or read information written in external flash memory.

Figure 5:
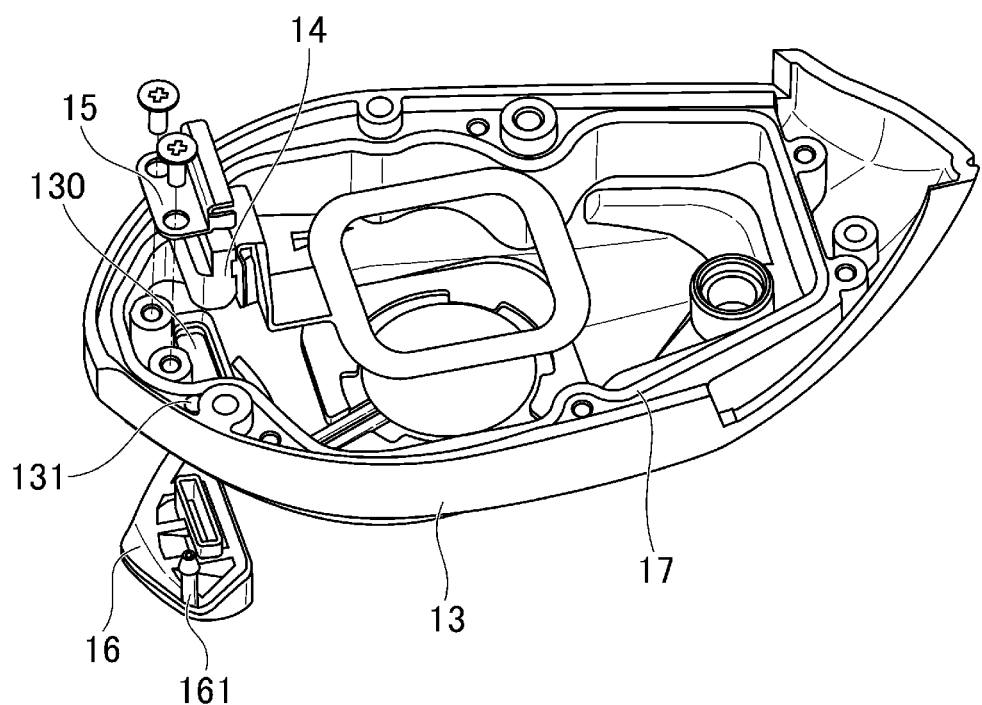
FIG. 5 is a drawing illustrating a method for fastening (attaching) an external-device connection unit to a fishing reel according to an embodiment of the present disclosure.

Next, with reference to FIG. 5, a method for fastening (attaching) the external-device connection unit 14 to the fishing reel 1 according to an embodiment of the present disclosure will be described. FIG. 5 is an exploded perspective view of the opposite side cover 13 and the external-device connection unit 14.

In the fishing reel 1 according to an embodiment of the present disclosure, the opposite side cover 13 has a through-hole 130 that is open to a side adjacent to the opposite side cover 13 (open upward in a superior-inferior direction of a paper surface of FIG. 1) when viewed along the spool axis (in the superior-inferior direction of the paper surface of FIG. 1). The through-hole 130 is made slightly larger than the housing of the external-device connection unit 14. A size and a location of the through-hole 130 can be flexibly selected to suit a size and an installation location of the external-device connection unit 14 and are not limited to any specific style. The external-device connection unit 14 is inserted into the through-hole 130, and the fishing reel prevents ingress of water through between the opposite side cover 13 and the external-device connection unit 14 by action of the external waterproof part and thus is able to maintain the watertight structure even with the through-hole formed in the opposite side cover 13.

As shown in FIG. 5, a detachment prevention member 15 formed by a material such as a sheet metal is disposed on a side opposed to the opening of the external-device connection unit 14 (the opening 142 in FIG. 4) (on an upper side in the superior-inferior direction of the paper surface of FIG. 4). The detachment prevention member 15 is fastened to the opposite side cover 13 with screws or other fasteners and the external-device connection unit 14 is thereby attached to the opposite side cover 13. The detachment prevention member 15 may be a member made by resin molding but is not limited to these materials. The method for fastening the detachment prevention member 15 to the opposite side cover 13 may be other joining means such as press fitting, bonding, or welding but is not limited to these means. The detachment prevention member 15 fastened to the opposite side cover 13 makes it possible to reduce places at which a reaction force occurs when the external-device connection unit 14 is pressed by an external force. This can diminish an effect exerted on the whole apparatus when the connector is removed or inserted. The external-device connection unit 14 can be disposed beside the circuit board (control substrate) 12 and the battery 11 in a radial direction of the spool or a direction orthogonal to the spool axis (for example, in a lateral direction of the paper surface of FIG. 1).

A cap 16 is put over the through-hole 130 of the opposite side cover 13 from the outside. This prevents ingress of water and dust into the external-device connection unit 14 from the outside. The cap 16 can be removed from the external-device connection unit 14 to connect the connector of the external device and can be put on the external-device connection unit 14 when the connector of the external device is not connected. The cap 16 put over the through-hole also produce the effect of helping the user to hold the palm-side portion 23.

The cap 16 has a detachment prevention part 161. The detachment prevention part 161 can be press-fit into a cap fixing hole 131 formed in the opposite side cover 13. This prevents the removed cap 16 from falling off or being lost. The cap fixing hole 131 can be provided outside the closed loop (waterproof loop) formed by the waterproof joining means 17 so as to pass through the opposite side cover. This configuration can appropriately and reliably prevent the cap 16 from falling off without hindering the function of the watertight structure.

As described with reference to FIGS. 1, 4, and 5, in the fishing reel 1 according to an embodiment of the present disclosure, the external-device connection unit 14 is configured to constitute a part of the watertight structure. This allows components such as the internal connection part 144, the circuit board (control substrate) 12, the battery 11, and the motor 9 to be accommodated inside the watertight structure. Various sensors used to grasp the state of the fishing reel, such as the rotation of the spool 3, temperature inside the fishing reel, and the status of the clutch, may be accommodated inside the watertight structure. In this way, even with the external-device connection unit 14 connectable to the external device, the fishing reel allows the watertight structure to be maintained and various components (electrical components) to be disposed inside the watertight structure. This configuration allows the fishing reel to achieve cost reduction and miniaturization compared to a case in which waterproof treatment is applied to each of components (electrical components). With the external-device connection unit 14 constituting a part of the watertight structure, this configuration is able to communicate with the external device, supply any of the electrical components with electricity from the outside, and supply or charge a secondary battery that is rechargeable and is used as the battery, with electricity. This helps to improve functionality and usability of the fishing reel.

If the external-device connection unit 14 is, for example, configured to be connectable to USB devices, the external-device connection unit 14 of the fishing reel according to the technique of JP 2004-357601 A described above increases in size in a direction in which the connector is removed or inserted. On the other hand, in the fishing reel 1 according to an embodiment of the present disclosure, as described above, the external-device connection unit 14 is disposed beside the circuit board and the battery in the radial direction of the spool, and this contributes to a reduction in size of the watertight structure in a direction of thickness (a direction along the spool axis). This configuration can avoid an increase in size of the overall reel apparatus (upsizing in the direction along the spool axis).

The opposite side cover 13 is required to have the palm-side portion of a convex shape, and the convex-shaped portion may be formed by resin molding to reduce costs and ensure design flexibility. In this case, a direction of mold removal is the radial direction of the spool. Thus, when the through-hole 130 is made open in the direction as described above, a shape of the mold can be simplified, and this leads to a reduction in cost of the opposite side cover 13.

Further, since the connector of the external device can be inserted through the through-hole 130 of the opposite side cover 13 that has the palm-side portion 23, the connector of the external device can be connected to the reel under normal usage conditions without the necessity of disassembling the reel. This allows connection work to be performed with satisfactory usability. In particular, if the reel is connected to the connector of the external device for applications, such as supplying or charging a secondary battery with electricity, that are performed with relatively high frequency, the fishing reel offers great convenience to the user because the work of connection to a connector counterpart is easy under normal usage conditions. If the connector of the external device is removed and inserted with high frequency, the external-device connection unit 14 is required to have a mechanical structure that can withstand repeated use. A structure provided by the fishing reel is such that the through-hole 130 is formed in the opposite side cover 13, the external-device connection unit 14 is inserted into the through-hole, and the external-device connection unit 14 is held by the detachment prevention member. This structure ensures strength with which the external-device connection unit 14 is held.

The dimensions, materials, and arrangement of components described in the present specification are not limited to those explicitly described in the embodiment. The components can have any modified dimensions, materials, and arrangement that are included within the scope of the present disclosure. A component that is not explicitly described in the present specification can be added to the described embodiment, and some of the components described in the embodiment can be omitted.

REFERENCE SIGNS LIST 1 fishing reel
2 frame (main reel body)
3 spool
4 braked part (braked means)
5 bearing
6 braking part (braking means)
7 set plate
8 inner lid
9 motor
10 deceleration mechanism (reduction gear train)
11 battery
12 circuit board (control substrate)
13 cover on opposite side from operating part (opposite side cover)
14 external-device connection unit
21 first side plate
22 second side plate
23 palm-side portion
24 operating part
61 rotating magnet
62 stationary magnet
130 through-hole
131 cap fixing hole
141 housing
142 opening
143 external connection part (outside connection part)
144 internal connection part (inside connection part)
145 internal waterproof part
146 external waterproof part

What is claimed is:

1. A fishing reel comprising: a circuit board that has a printed circuit on a surface; a plurality of electrical components electrically connected to the circuit board, the plurality of the electrical components comprising a microcomputer to control the fishing reel through a control program; an external-device connection unit electrically connected to the circuit board, the external-device connection unit being configured to connect to an external device; and a watertight structure to accommodate the circuit board inside, wherein
the external-device connection unit comprises: an external connection part disposed outside of the watertight structure, the external connection part being designed to electrically connect to a connector of the external device; an internal connection part disposed inside of the watertight structure, the internal connection part being designed to electrically connect to the circuit board and the external connection part; an internal waterproof part to make a gap between the external connection part and the internal connection part waterproof; a housing to hold the external connection part, the internal connection part, and the internal waterproof part; and an external waterproof part to make a gap between the housing and the watertight structure waterproof.

2. The fishing reel according to claim 1, further comprising: a spool designed to wind a fishing line by operation with an operating part; a first side plate having the operating part, the first side plate axially supporting the spool; a second side plate disposed opposite to the first side plate when viewed along an axis of the spool, the second side plate axially supporting the spool; and an opposite cover or a cover opposite to the operating part, the opposite cover covering the second side plate on a side opposed to the operating part, wherein
the opposite cover is included in a part of the watertight structure, the opposite cover has a through-hole that is open in a direction along the axis of the spool, and the external-device connection unit is disposed by being inserted into the through-hole and is held by a holding member fixed to the opposite cover.

3. The fishing reel according to claim 1, wherein the circuit board and the external-device connection unit are disposed beside each other in a direction in which the circuit board extends.

4. The fishing reel according to claim 1, wherein the watertight structure accommodates a secondary battery that is rechargeable and is designed to supply or charge the secondary battery with electricity through the external-device connection unit to which the external device is connected.

5. The fishing reel according to claim 1, further comprising a secondary battery, and wherein the secondary battery and the external-device connection unit are disposed beside each other in a direction orthogonal to an axis of the spool.

6. The fishing reel according to claim 2, wherein the opposite cover has a recess outside of the watertight structure, and a cover member is detachably attached to the recess of the opposite cover to protect the external-device connection unit against dust.

* * * * *